United States Patent [19]

Berkman

[11] 4,430,149
[45] Feb. 7, 1984

[54] CHEMICAL VAPOR DEPOSITION OF EPITAXIAL SILICON

[75] Inventor: Samuel Berkman, Florham Park, N.J.

[73] Assignee: RCA Corporation, New York, N.Y.

[21] Appl. No.: 335,683

[22] Filed: Dec. 30, 1981

[51] Int. Cl.$^3$ .................................... H01L 21/205
[52] U.S. Cl. .................... 156/613; 156/662; 427/86; 427/255.1; 427/255.5; 427/255; 118/718; 118/719; 118/729; 118/733
[58] Field of Search .............. 427/255.1, 255.2, 255.5, 427/255, 86, 95; 118/718, 719, 729, 733; 156/611, 612, 613, 614, 662

[56] References Cited

U.S. PATENT DOCUMENTS

| | | | |
|---|---|---|---|
| 3,602,192 | 8/1971 | Grochowski et al. | 118/719 |
| 3,672,948 | 6/1972 | Foehring et al. | 427/255 |
| 3,893,876 | 7/1975 | Akai et al. | 118/729 X |
| 4,048,955 | 9/1977 | Anderson | 118/718 |
| 4,123,244 | 10/1978 | Leclercq et al. | 118/720 |

OTHER PUBLICATIONS

"An Analysis of the Gas-Flow Dynamics in a Horizontal CVD Reactor" by S. Berkman et al., Chapter 7, in the text Heteroepitaxial Semiconductors for Electronic Devices, edited by G. W. Cullen et al., 1978, Springer-Berlag, New York.

Primary Examiner—John D. Smith
Assistant Examiner—Bernard F. Plantz
Attorney, Agent, or Firm—Birgit E. Morris; Donald S. Cohen; Joseph D. Lazar

[57] ABSTRACT

A single chamber continuous chemical vapor deposition (CVD) reactor is described for depositing continuously on flat substrates, for example, epitaxial layers of semiconductor materials. The single chamber reactor is formed into three separate zones by baffles or tubes carrying chemical source material and a carrier gas in one gas stream and hydrogen gas in the other stream without interaction while the wafers are heated to deposition temperature. Diffusion of the two gas streams on heated wafers effects the epitaxial deposition in the intermediate zone and the wafers are cooled in the final zone by coolant gases. A CVD reactor for batch processing is also described embodying the deposition principles of the continuous reactor.

5 Claims, 8 Drawing Figures

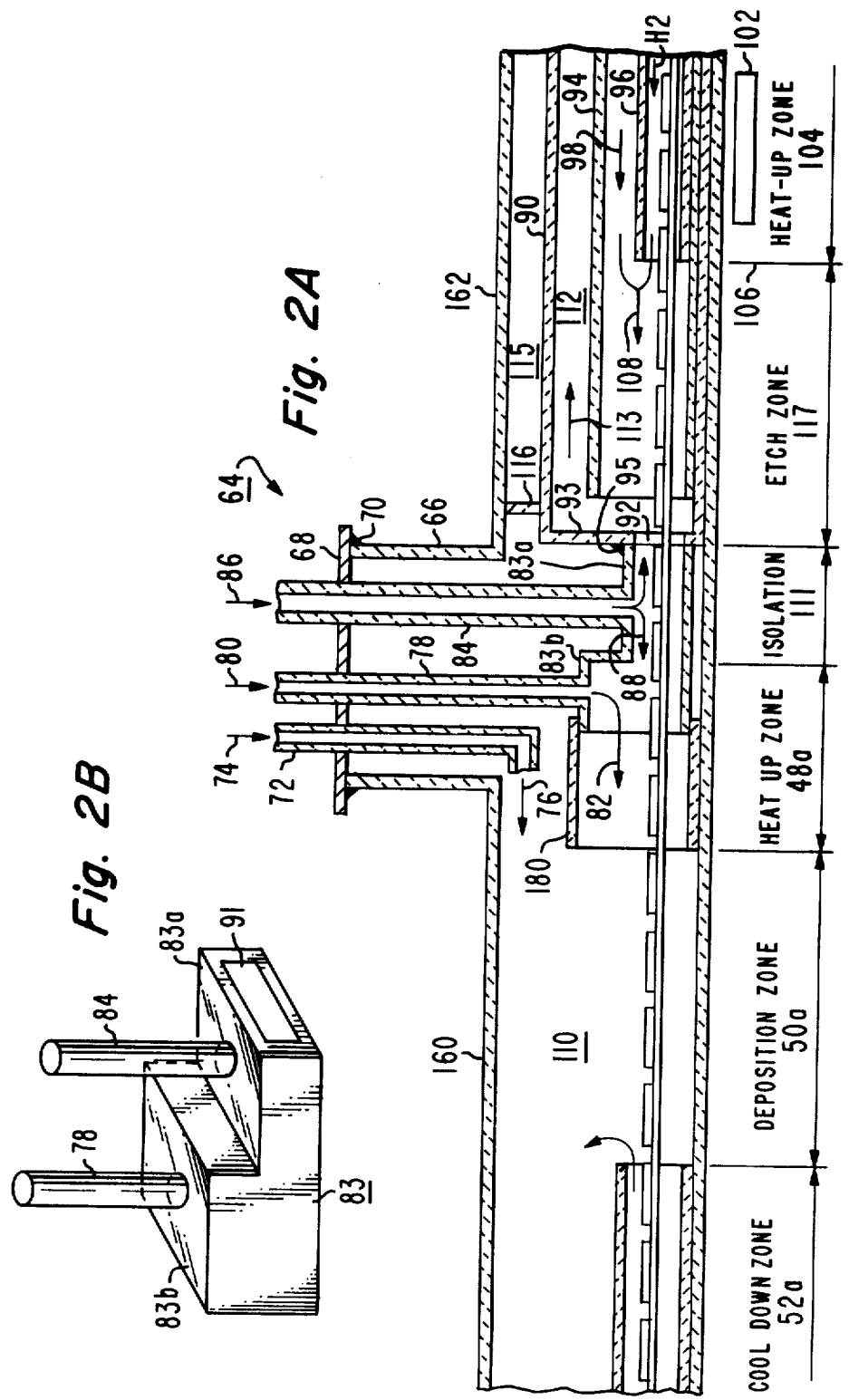

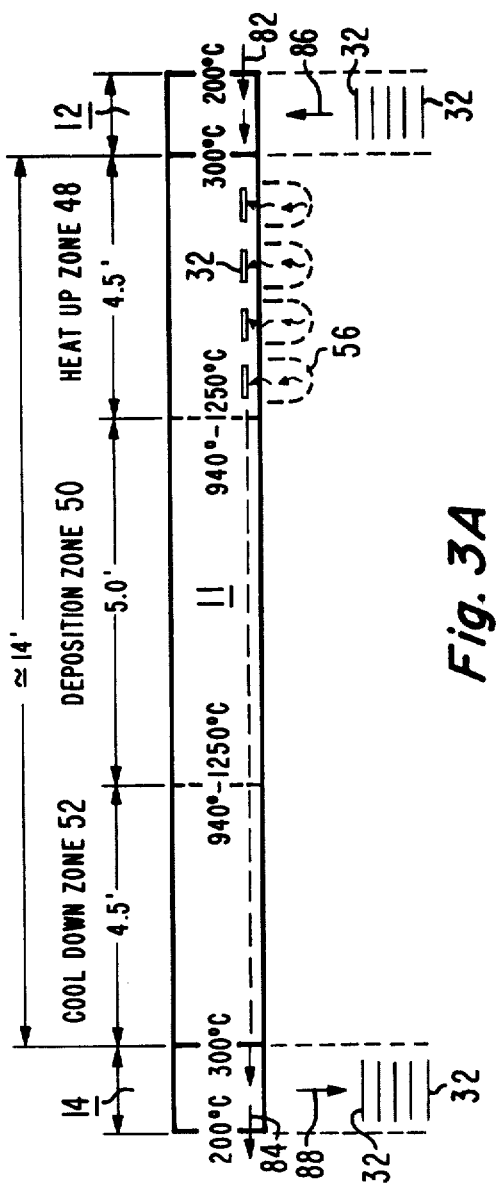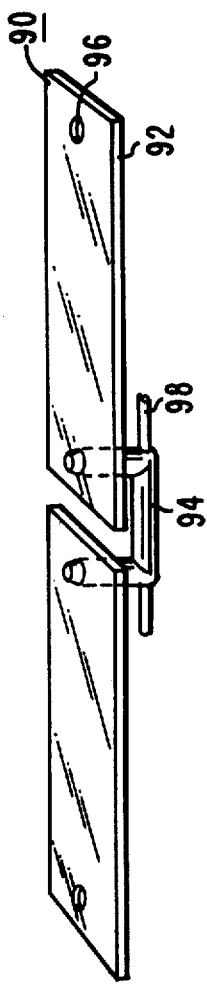

CHEMICAL VAPOR DEPOSITION OF EPITAXIAL SILICON

The Government of the United States of America has rights in this invention pursuant to Subcontract No. XS-0-9100-3 awarded by the Department of Energy.

This invention relates to chemical vapor deposition (CVD) and particularly to a continuous chemical vapor deposition process and apparatus.

BACKGROUND OF THE INVENTION

CVD reactors in the semiconductor processing field serve to deposit a layer of material on the surface of a substrate formed of a material such as silicon. One form of such reactors deposit a hetero-or homoepitaxial layer of monocrystalline silicon on a wafer of monocrystalline silicon. The layer can be provided with a dopant to convert the layer to an N-type semiconductor with, for example, phosphorus or a P-type semiconductor with boron. A conventional reactor using chemical vapor as the agent to deposit the epitaxial layer is termed a chemical vapor deposition (CVD) reactor. Several steps are needed to achieve the final deposition layer, each step being at a different temperature than the other steps. For this reason separate compartments or sections of the reactor are needed to provide the different temperature conditions of the several steps of the process. Accordingly, seals are used to isolate the chamber from the external ambient during each step of the process.

Many CVD reactor chambers have been proposed using fluid cooled elastomer seals to achieve the desired isolation of the chambers. While such seals have proved adequate for low or moderate temperature polycrystalline CVD deposition of silicon, silicon oxide, or silicon nitride, they have not been successful in use for high temperature production of silicon epitaxial devices.

Several continuous vapor deposition reactors have been proposed. For example, see U.S. Pat. No. 4,048,955 entitled CONTINUOUS CHEMICAL VAPOR DEPOSITION REACTOR BY R. N. Anderson, issued on Sept. 20, 1977. This patent describes a reactor having a plurality of chambers that are separated from each other along the path of movement of wafers passing therethrough by the use of elastomer seals to achieve the desired isolation of one chamber section from the other. The quartz reactor chambers of this patent are joined to one another by multi-ported fluid cooled, flanged junctions sealed with silicon rubber. The junctions include directed gas streams that are used to separate the atmosphere in the various adjacent CVD deposition chambers. The difficulty with the use of this type of reactor is that silicon wafers, for example, must pass through the fluid cooled junctions at high temperatures, that is, temperatures greater than 1120° C., the minimum temperature required for conventional silicon epitaxial growth. The wafers are then exposed to the cold gases exiting from the junctions onto the wafers. The wafers as they pass through the cold junctions cannot be sustained at the required heat by infrared lamps. The operation of the isolation junctions require very small passage clearances for the wafers and their carriers, such clearances being in the order of 1 mm. Using hydrogen carrier gas which is typically used for epitaxial deposition and the practical materials used in such reactor construction, it appears that the junctions will either be overheated or that the silicon wafers would be under-cooled as they pass through each of the isolation junctions. Another disadvantage of the system of the Anderson U.S. Pat. No. 4,048,955 is that it requires infrared heating. Induction or resistance heating cannot be used without interfering with the correct use of the reactor junctions.

See, also, U.S. Pat. No. 3,672,948 entitled METHOD FOR DIFFUSION LIMITED MASS TRANSPORT by R. A. Foehring, et al. issued on June 27, 1972. This patent discloses a continuous reactor having a single chamber through which a carrier for substrates is passed during the deposition process steps. The various gases used during the process are passed into the chamber across the movement direction of the wafers. It seems that the gas flow across the wafer movement produces inherently non-uniform deposits, as seen from the growth rate curves of FIG. 5 of the patent, since the material in the gas is depleted across the wafers. Moreover, a system such as that of the patent, using the perforated or porous members, can easily clog and cause frequent shut-downs. In addition, such porous members, being formed of quartz, are very fragile. If such members are formed of metal, then the chemical source gas containing chlorine can react with the metal and develop contaminants to harm the substrates or wafers being processed.

Prior art continuous chemical vapor deposition reactors are not known to be used in production for silicon epitaxial devices. The reason for this, seemingly, is that single crystal epitaxial devices grown in such reactors cannot tolerate any leakage of the atmosphere, external from the reactor, or any out-gassing of the elastomer seals which might result from deterioration due to prolonged use at excessive temperatures. Amorphous and polycrystalline growth of silicon, silicon oxide and silicon nitride can be accomplished in the temperature range of approximately 350° to 900° C. In contrast, silicon epitaxial temperatures commonly used in production are in the range 1050° to 1250° C. Except for very special applications using silane at 960°–1000° C. the preferred minimum temperature for silicon epitaxial growth is 1120° C. to 1140° C. using other silicon halide gases as a source material which is sometimes termed a "gaseous phase material," or a "chemical source gas stream."

It is clear there is a need in the art for an improved CVD reactor for epitaxial growth of silicon useful in solid state device structures.

SUMMARY OF THE INVENTION

A continuous CVD reactor is formed of an elongated open chamber having input and output sections. Two separated gas streams comprising respectively first a chemical source gas stream, such as silane, with a carrier gas, such as hydrogen, and second a stream of hydrogen are provided in laminar flow longitudinally along the chamber. Substrates, such as silicon wafers, are moved continuously in serial fashion through the chamber and adjacent the carrier gas in the first zone of the chamber. The substrates are heated while being kept separated from the source gas in the first zone of the chamber. The two gas streams are arranged to meet in the deposition zone to effect a reaction by the diffusion of the two streams on the heated wafers whereby the material from the one stream is epitaxially deposited on the substrates. Thereafter, the substrates are continued along the chamber into a third zone within which they are allowed to cool while being exposed to a longitudinally flowing gas in a direction opposite to the movement of the substrates.

In another aspect of the invention the two separated gas streams are combined after the wafers are heated in a conventional CVD batch process reactor.

DETAILED DESCRIPTION OF A PREFERRED EMBODIMENT

Figure 1:
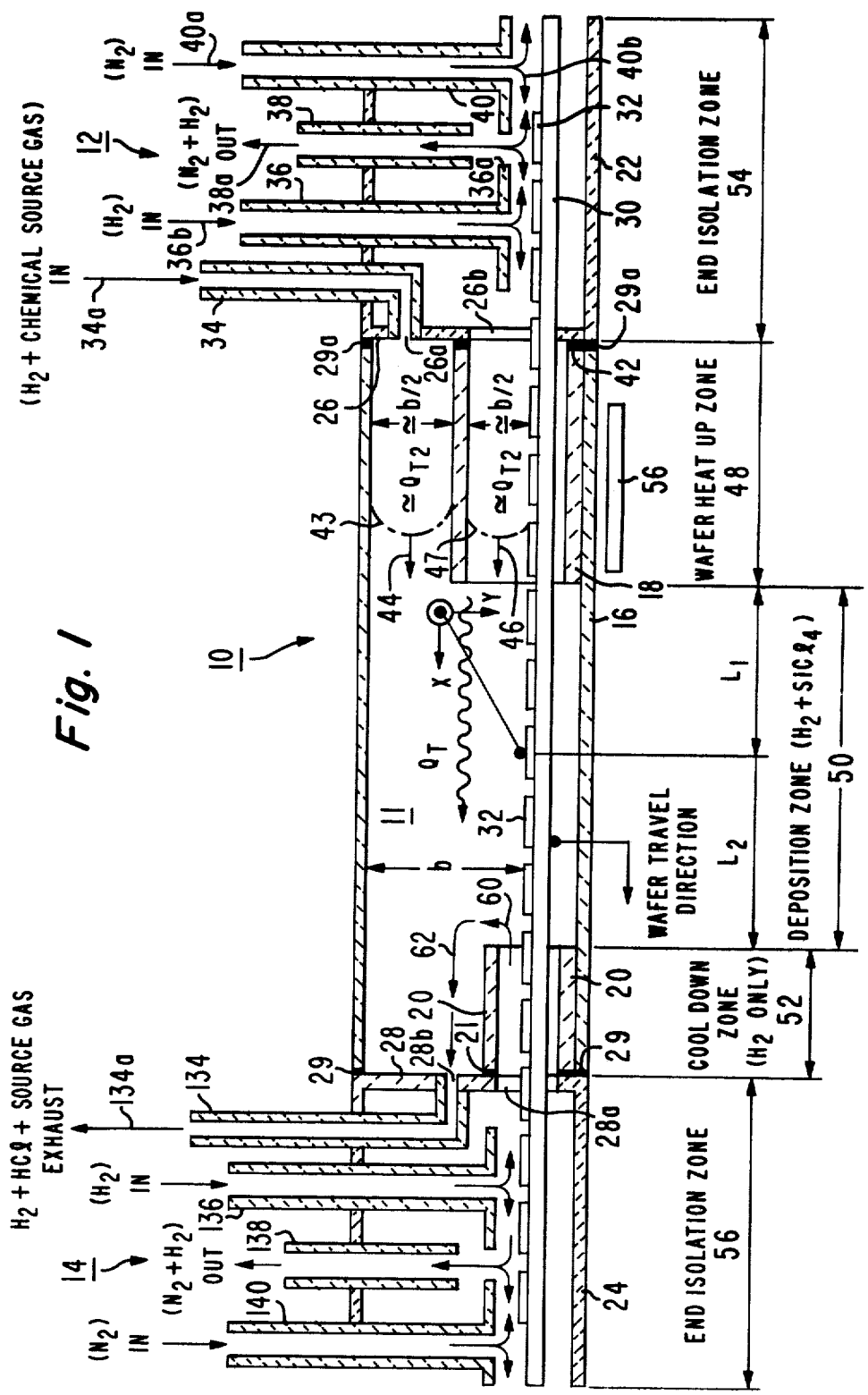
Figure 4:
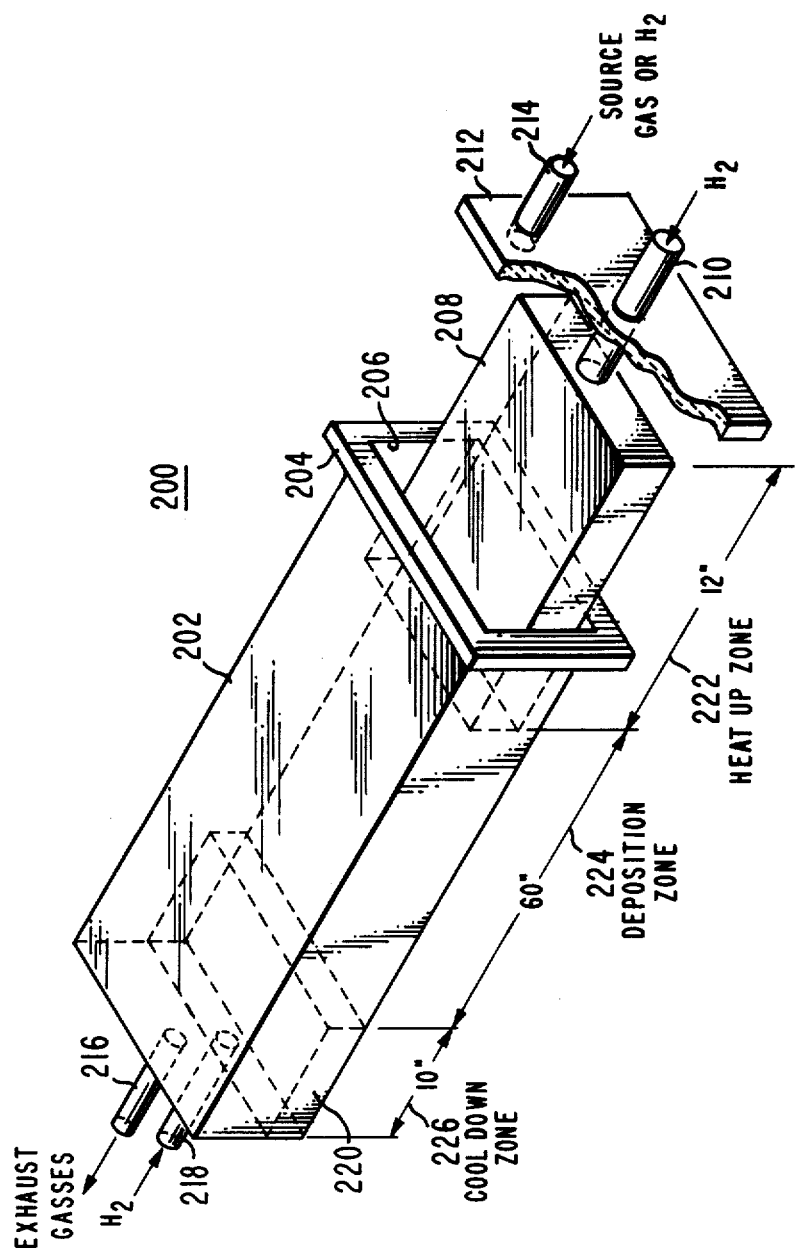
Figure 5:
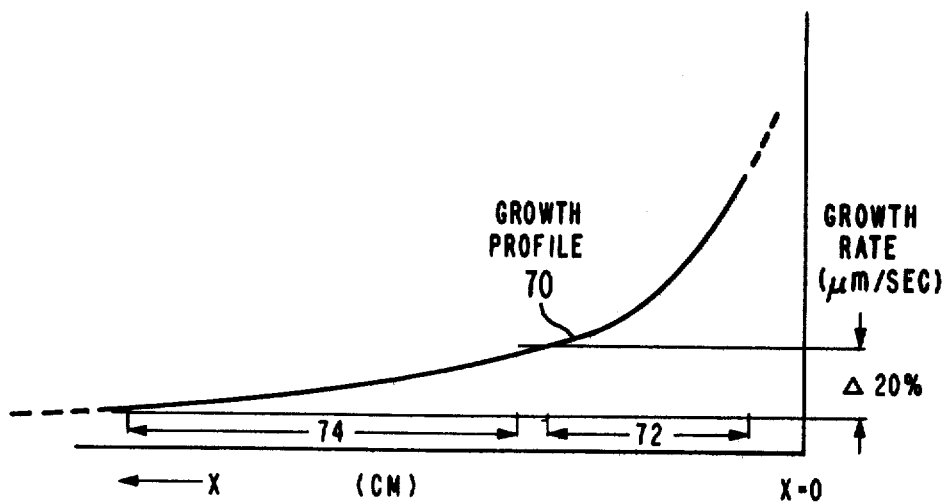
Figure 6:
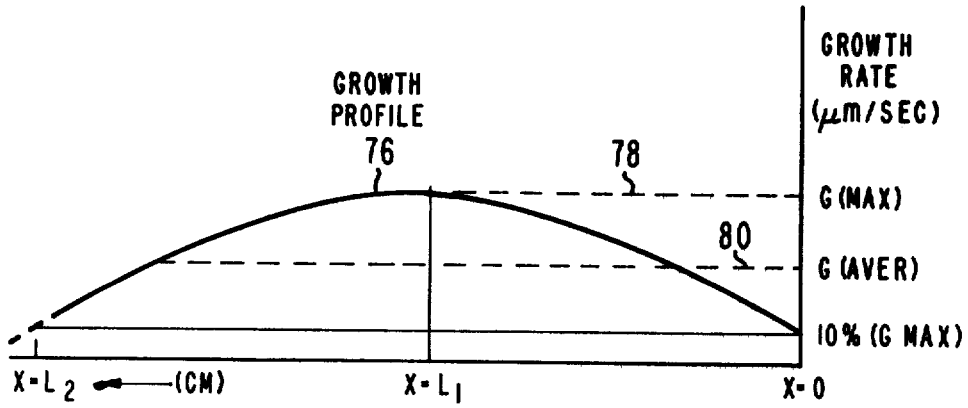

The drawing to which reference shall be made in the following description comprises:

FIG. 1 which is a schematic in a sectional elevation of a continuous epitaxial reactor according to the invention;

FIGS. 2A and 2B which are fragmentary schematics in sectional elevation and; perspective, respectively, of a modification of the reactor of FIG. 1 for effecting etching of the substrates prior to deposition;

FIG. 3A which is a schematic showing temperatures at various portions or zones of the reactors of FIGS. 1 and 2; and FIG. 3B which is a perspective view of a suitable wafer or substrate carrier FIG. 4 is an isometric schematic of an experimental CVD reactor according to the invention also useful for batch processing; and FIGS. 5 and 6 are plots of deposition profiles, respectively, of the prior art compared to the present invention.

Reactor tube 10 as shown in FIG. 1 is formed of an elongated outer tube 16, rectangular in cross section, defining a reactor chamber 11, a first inner rectangular tube 18 and a second inner rectangular tube 20 both in telescopic relationship with tube 16 and having their respective longitudinal axes parallel to the longitudinal axis of tube 16. The tubes 16, 18 and 20 are formed of quartz or vicor. Tube 16 is typically about 15 feet (4.5 meters) long while tubes 18 and 20 are each typically 4.5 feet (1.37 meters). The respective heights of the tubes above the substrates are about 1.5 to 2 inches (3.8 to 5 cm) as indicated by height b for tube 16 while tube 18 is approximately half that height, namely b/2 and tube 20 is about ¼ of that height, namely b/4. The respective widths of the tube 16, 18 and 20 are about 18 inches (45.7 cm) wide along the direction into the paper as seen in FIG. 1.

Input section 12 and output section 14 are formed of metal advantageously since they can be and are operated at relatively low temperatures according to the invention as compared to the higher operating temperatures within the reactor tube 10. Input section 12 is formed of an input section tube 22 which is rectangular in cross section, mating with the outer tube 16. Tube 22 is suitably attached to a tube input end wall 26 formed of metal having an aperture 26a for receiving a tube 34 and an aperture 26b arranged to receive wafers 32 into chamber 11 of the tube 10 through a tube 18 in register with aperture 26b. Tube 18 within tube 16 thus defines two passageways for two respective gas streams, as will be further explained.

A ramp or rail 30 is suitably positioned in the reactor structure to support the movement of susceptors (not shown) carrying substrates such as wafers 32 from a supply location not shown through the input section 12 into the chamber 11 and thence outward from the output section 14 for the processing.

A suitable means, such as a wafer susceptor, is positioned on the ramp 30 and moved by suitable means at a selected rate through the reactor. Suitable wafer moving means are shown in the above-identified U.S. Pat. Nos. 4,043,955 and 3,672,948. A tube 36 is provided through the upper wall of tube 22 and is provided with a flanged portion 36a extending longitudinally in the reactor and spaced above the upper surface of the substrates 32 to allow a passage of a carrier gas such as pure hydrogen as indicated by arrow 36b. A tube 38 is provided in the upper wall of tube 22 to exhaust gases, such as nitrogen and hydrogen, as shown by arrow 38a. A flanged tube 40 is also provided in the upper wall of tube 22 to carry a purge gas such as nitrogen, into the system as indicated by the arrows 40a and 40b. Tube 34 carries the gaseous phase material such as trichlorosilane plus hydrogen as a carrier directly into the chamber 11 as by arrow 34a, as will be further explained.

The output section 14, also formed of metal, includes an output section tube 24 of similar construction as input section tube 22 and is provided with a series of supply and exhaust tubes similar to the tubes for input section 12. Thus, tube 134 provides an exhaust as indicated by arrow 134a of the gases from the chamber 11 comprising hydrochloric acid and trichlorosilane that has not been deposited on the wafers. Tube 136 provides an input for the hydrogen needed to purge the exiting wafers 32 and flanged tube 140 provides an inlet for the pure nitrogen also used to isolate the wafers 32 from the ambient as they exit from the deposition chamber 11. Tube 138 carries the gases from the output section.

A metal wall 28 closing the end of metal tube 24 is connected by a suitable seal means 29 to the open end of quartz tube 16. Seal means 29 may, for example, consist of annular flanges extending respectively from the ends of quartz tube 16 and metal tube 24. An elastomer seal member, such as silicon rubber, is positioned between the flange to effect a seal of the mating flanges when compressed. A bolted clamping means is also provided in such seal means to compress the flanges together, thereby connecting and sealing the tubes 16 and 24 together. A suitable seal means is illustrated in FIG. 4, to be described. Other convenient ways of connecting and sealing a quartz tube to a metal tube may be used if desired.

Tube 134 is mounted to an aperture 28b in wall 28. Chamber tube 20 is mounted in register to an aperture 28a in wall 28 by another seal means 21, similar to seal means 29. Tube 20 thus provides an exit passageway from chamber 11 for the wafers 32. Similarly, the opposite metal end wall 26 is connected and sealed to the input end of quartz tube 16 by a similar seal means 29a. It should be appreciated that the seals of elastomer that can be used will have a relatively low temperature for melting and decomposition at about 250° C. According to the invention the temperature at these tubular end portions of the reactor is low enough to be able to utilize such a relatively simple seal.

While the input and output sections 12 and 14 are arranged as shown in FIG. 1, other arrangements can be used to provide isolation of the chamber 11 from the ambient as the wafers 32 are moved therethrough. Thus, the input and output sections 12 and 14 can be constructed so as to make use of standard gas isolation practices using gas seals as illustrated, for example, in the above-identified U.S. Pat. No. 4,043,955 or designed to feed the wafers by a suitable cartridge feeding mechanism of conventional form from a sealed and purged compartment into the reactor.

In operation the reactor of the invention provides, for example, a single epitaxial layer for an integrated circuit device or one layer for a thin film epitaxial solar cell, using, for example, trichlorosilane as the chemical source gas which is known to have a conversion efficiency of about 80% resulting in 20% of the material being exhausted from the system. A preferred form of a chemical source gas for epitaxial deposition purposes is dichlorosilane ($SiH_2Cl_2$) since this form of gaseous phase material can approach or go to a complete reaction within the chamber 11. A mixture of chemical source gas and hydrogen is passed through tube 34 to provide a gas stream of chemical source gas as represented by velocity profile 43 and arrow 44. Pure hydrogen, serving as the purge gas, is applied to the system via tube 36 passing both rearwardly and forwardly through the aperture 26b represented by arrow 46 and into the interior of tube 18 developing a velocity profile 47 of hydrogen. The streams of source gas and hydrogen gas are respectively passed through the two passages in the chamber 11 spaced apart by the upper wall of the first inner tube 18. The respective heights of the two passageways are about equal and define or constrain the stream to be substantially laminar with very little turbulence.

The respective heights, actually the cross-sectional areas, of the upper and lower passageways in the first zone of the chamber, namely, the wafer heat-up zone 48, are selected according to design requirements. In the example illustrated, the heights and areas are equal for convenience. Conventional laminar flow design equations are used, in the practice of the invention, to determine the parameters of longitudinal length and height to establish substantially laminar flow of both gas streams. See "An Analysis of the Gas-Flow Dynamics in a Horizontal CVD Reactor" by S. Berkman, V. S. Ban and N. Goldsmith, published as Chapter 7 in the text entitled "Heteroepitaxial Semiconductors for Electronic Devices" edited by G. W. Cullen and C. C. Wang, 1978 by Springer-Berlag, New York, for conventional for laminar flow equations. In order to minimize or at least reduce the turbulence of the respective gas streams defined by velocity profiles 43 and 46, the forward momentum of the two streams must be balanced, that is they must be substantially equal. This can be achieved by providing suitable input pressures of the respective gas streams through tubes 34 and 36 and to provide the proper geometry of the passageways.

In the alternative, or, indeed, as a supplement of the source gas means, a low momentum injection system, for example a transverse tube not shown with a suitable number of small holes or apertures, can be used to introduce the chemical source gas and the carrier gas into the upper passageway of the tube 10. Such an arrangement will serve to reduce or minimize turbulent flow of the gas.

By maintaining the separation of the two gas streams before they are brought together for deposition. The wafers 32 are heated continuously as the two separated gas streams progress through the tube 10. A suitable heating mechanism 56, such as an RF coil, resistance coil or infrared (IR) lamps, is placed around or near the tube 16 in zone 48 to provide heat to the wafers 32. A suitable susceptor, not shown, is provided to respond to the heating mechanism to develop the heat to heat the wafers in a manner well known in the art. As the wafers 32 are moved longitudinally into the chamber 11, they are heated as they progress from right to left in what shall be termed the heat up zone 48. The rate of movement of the wafers 32 throughout the entire system and particularly in the heat up zone 48 is selected to allow the wafers to arrive into the chamber 11 at a relatively low temperature of about 300° C. and thence to progress through the tube 18 for heating to exit at the left end into what is termed the deposition zone 50 at a temperature of about 1100° to 1160° C. The wafers 32, it will be noticed, are entering into the deposition zone 50 in the environment of a carrier gas of pure hydrogen. As the wafers 32 move into the deposition zone 50 they are exposed to the reactive chemicals derived from the chemical source gas stream that diffused downwardly from the stream 44.

The two streams of gas combine as indicated above at the end of the tube 18 to provide a total flow $Q_T$. The forward velocity of the reactive gas molecules are caused to travel a horizontal distance $X = Vt$ (as shown in FIG. 1) while they are diffusing downwardly towards the wafer 32 by the relationship $y = Dt$, where V is the velocity of the gas stream, t is time and D is the diffusion coefficient. One can determine analytically where each reactive gas particle will be on the surface of the wafers 32. In general, the theoretical relationship of what is known as the mass transport equation can be determined from the literature and particularly the theory of gas flow. See the above-cited Chapter 7 by Berkman, et al. for a description of the theoretical and practical aspects of CVD reactors. From the fundamental equations of mass transport one can determine the gas flow for the system according to the present invention as follows:

$$G(L1) = \frac{3.52 \cdot 10^5 \eta D_T^{3/2} X^{\frac{1}{4}} P_O}{T_A b^2 V_T^{\frac{1}{4}}} \exp - \frac{2.67\eta}{b^3} \left(\frac{D_T X}{V_T}\right)^{3/2} \quad (1)$$

wherein G ($L_1$) is the growth rate in micrometers per minute along the direction of length $L_1$ as shown in FIG. 1, that is, through the distance $L_1$ where X starts at 0 and approaches $L_1$ and wherein $L_1 = b^2 V_T/4D_T$ where b is the height above the wafers in the chamber 11 and and $D_T$ is as defined hereinabove; $\eta$ is the thermodynamic chemical efficiency of the reactive gas which is typically 0.8; $D_T$ is the diffusion coefficient of the gas in $H_2$ at the average gas temperature ($T_A$); $P_O$ is the input partial pressure of the chemical source material species (trichlorosilane, e.g.); $T_A$ is the average gas stream temperature in the deposition zone 50; b is the height of tube 16; $V_T$ is the velocity of the gas streams at the average temperature ($T_A$), and X is the distance in deposition zone 50.

Similarly, the equation to determine the mass transport in the deposition zone defined by the distance $L_2$ of zone 50 is represented as follows:

$$G(L2) = \frac{1.76 \cdot 10^5 \eta D_T P_{L1}}{T_A b} \exp - \frac{2\eta D_T X}{V_T b^2} \quad (2)$$

wherein X is 0 at the full distance $L_1$ and $P_{L1}$ equals $P_O$ exp. 0.334 $\eta$ and is thus the partial pressure of the gas in zone 50 along distance $L_1$. According to equations (1) and (2) one can determine the amount of material that will be uniformly deposited in zone 50 on the wafers 32.

This effect will be better understood by reference to FIGS. 5 and 6 which demonstrate respectively the growth profile in a system of the prior art, such as described in the previously-mentioned U.S. Pat. No. 4,048,955 and the growth profile according to the present invention. FIG. 5 shows the growth profile 70 plotting the growth rate or deposition rate in micrometers/sec against the distance X in centimeters over the surface of the substrate or wafer receiving the deposition material. Such a plot would apply to any deposition system of the prior art whether in a stationary or moving wafer environment. It is to be appreciated that the relative movement of the gas stream over the surface of the wafer is what effects the deposition rate across the wafer. If the wafer is moving relatively to the gas stream then the rates of deposition are modified accordingly. The distance X represents in a system such as described in U.S. Pat. No. 4,048,955, the growth rate profile along the longitudinal axis of the chamber with the wafers moving in the same direction. The growth rate profile would also be applicable to a system in which the distance X is transverse the movement along the longitudinal axis of the chamber as illustrated in the above-mentioned U.S. Pat. No. 3,672,948. Moreover, it should be understood the principle of the invention is applicable to conventional CVD batch reactors in which the substrates or wafers are stationary.

The significant aspect of the prior art concept of deposition from a chemical source gas is the very high deposition rates that occur in the region identified in FIG. 5 as region 72. For this profile the prior art places the substrates or wafers such that the depositions occur in region 74 in order to make more uniform the deposited material. It will be appreciated that using this growth profile in practice is very inefficient and difficult to control for uniformity.

The growth profile 76 illustrated in FIG. 6 shows the growth of the deposited material in the chamber 11 according to the present invention in which the deposition starts at $X=0$ with about 10% of the maximum growth rate (G MAX) and increases to a maximum at a distance approximately at which $X=L_1$ (as shown in FIG. 1) and therefor reduces gradually to a small value depending on the thermodynamic properties of the chemicals at the distance wherein $X=L_2$. In practice, the profile 76 is adjusted such that the ratio of the maximum growth rate (G MAX) to the average growth rate (G AVER) is about 2 using equations (1) and (2). However, it should be understood that the profile 76 can be adjusted according to equations (1) and (2) to have different rates of deposition. Thus, the downstream portion in the vicinity where $X=L_2$ can be arranged to have a larger growth rate with the sacrifice of efficiency. Advantageously such a growth rate is useful in conventional CVD reaction for batch processing of wafers.

Thus, according to the principles of the invention, the wafers 32 see the same growth rate profile 76 (FIG. 6) they are uniformly deposited with an epitaxial layer of silicon derived from the gaseous phase material from the diffusion reaction of gas streams 44 and 46. This occurs in a continuous reactor in the deposition zone 50 between the tubes 18 and 20. The wafers then are passed into the tube 20 through which a counter flow of hydrogen from tube 136 is passed. This hydrogen gas is somewhat turbulent. The wafers will cool down to a temperature of about 300° C. Turbulence from the counter flow gas stream identified by the arrows 60 and 62 will be exhausted through the tube 134. Even though this flow is turbulent, the effects that would be considered to be intolerable in this zone of the process are tolerable according to this invention because the reactive gases will have been substantially depleted due to the epitaxial deposition in zone 50. The wafers 32 are then removed from the ramp 30 carrying the substrates and deployed for other steps of the semiconductor process that are to be performed on the wafers.

It should be understood that the velocity of the gas stream in a continuous reactor is greater than the movement of the wafers. In a typical design, the wafers will be moved at about 0.5 feet/min at the process temperature. That is, one wafer will pass through zone 50 of the reactor chamber 10 (FIG. 1) at about 0.5 feet/min. The velocity of the respective gas streams 44 and 46 is typically about 40 feet/min. Accordingly, a particular wafer will, upon passing through zone 50, receive a deposition layer of material that will be substantially uniform and moreover, each wafer will have substantially the same thickness as every other wafer preceding and following it since the thickness of the layer is determined by integrating the growth profile curve 76 (FIG. 6) over the distance each wafer moves.

The invention in practice utilizes preferably a chemical source gas such as dichlorosilane to provide the silicon material for deposition on the wafers. The gas as provided through tube 34 (FIG. 1) is typically mixed with hydrogen at a ratio of 50:1 of hydrogen to dichlorosilane. The ratio is adjusted as known in the art according to the desired rate and equations (1) and (2). The hydrogen in this gas stream thus serves as a carrier gas for the chemical source material. Hydrogen provided to the system via pipe 36 serves alone as an inert gas blanket in a continuous reactor to inhibit back flow of the chemical source gas from chamber 11 through tube 18 into the input section 12. Moreover, the hydrogen input serves as a viscous seal to isolate the chamber 11 from the input and output environment. Accordingly, the structure of the input and output sections can be formed of metal, because the temperatures in these sections are relatively low, about 200 to 300 C. as indicated in FIG. 3A, to be described.

In order to isolate the input section from the room environment and moreover to isolate the hydrogen, nitrogen is provided through pipe 40 and exited through pipe 38. Pipe 38 carries both the exhaust hydrogen as well as nitrogen. The exit section 14 also provides a viscous seal to isolate chamber 11 from the ambient by a similar supply of hydrogen and nitrogen as described above.

The reactor just described is a single zone or a single chamber hot reaction system which is capable of providing continuous deposition of thin film epitaxial layers for solar cells or I.C.'s. However, the reactor according to FIG. 1 does not provide for any etching of the wafers in situ. The deposition zone 50 can be relatively short, that is about 4-5 feet in length for high throughputs with modest epitaxial growth rates. Typically, a reactor zone 50 is approximately 5 feet long with a width of about 14 inches. Such a system can provide epitaxial layers with an average growth rate of 2 $\mu$m/minute, allowing for a production of 300, 4 inch square solar cell wafers/hour.

For systems in which it is desired to provide etching of the wafers prior to deposition, modification of the reactor of FIG. 1 is needed as illustrated in FIG. 2A. FIG. 2A illustrates the structure required for such a system. The structure of FIG. 2A replaces the input or right side of the structure shown in FIG. 1. End isolation zones such as zones 54 and 56 are omitted from the schematic of FIG. 2A. Such isolation zones however an provided to the input (right) arm output (left) sections of the structures of FIG. 2A. In order to provide an etching zone that is isolated from the deposition zone 50 of the reactor, a stacked tube design is used. The stacked tube 64 comprises a quartz T-joint 66 having a metal cap 68 connected thereto with an elastomer seal 70. Through the cap 68 is passed a tube 72 through which the chemical source gas is passed as indicated by arrows 74 and 76. A tube 78 is coupled into the chamber 110 (corresponding to chamber 11 of FIG. 1) for carrying hydrogen, as indicated by arrows 80 and 82. A tube 180, similar to tube 18 of FIG. 1, is used to maintain a separation of the chemical source gas flow 76 and the hydrogen gas flow 82 through the wafer heat-up zone 48a in a manner as described above with respect to FIG. 1. A hollow transition member 83 having stepped surfaces 83a and 83b and an aperture 91 (see in perspective in FIG. 2B) is positioned within tube 64 such as to provide two passageways for hydrogen as indicated by arrows 80 and 82 (tube 78) 86 and 88 (tube 84). The hydrogen gas serves both as a purging gas and a viscous seal to aid in the exhaust of the etchant gas and isolate the etching zone, as will be described. The split arrows 88 it will be noticed indicate that the hydrogen gas passes both forwardly and rearwardly to provide a viscous seal.

The T-joint 66 is connected to a quartz tube 162 which in turn extends to an end section such as end section 12 of FIG. 1. Within the tube 162 is provided a tube 90 with an end wall 93 having an aperture 92 in register with opening 92 for passing the wafers into the reaction chamber 110 through tube 180. A pressure-butt seal 95 seals wall 93 to member 83.

In telescopic relationship within tube 90 are another pair of telescoping tubes 94 and 96. Tube 96 is provided with a stream of heated hydrogen aiding to heat up the wafers 32 passing therethrough. Above tube 96 is passed a stream of an etchant gas of, for example, hydrogen and hydrogen chloride as indicated by arrow 98. This etching gas stream 98 is kept separate from the wafers 32 in tube 96 while the wafers are heated in zone 104 by a suitable heating means 102, such as an RF coil. The wafers are heated in this heat-up zone 104 to a temperature of about 1200°–1220° C. At position 106, at the end of tube 96, the gas flow 98 mixes with the hydrogen gas as shown by arrows 108 to etch the wafers 32 in the etch zone 117. As the wafers 32 pass out through the left end of tube 94, into isolation zone 111, they pass through the aperture 92 into tube 180. In this zone 111, the purging gas 88 is passed over the wafers and exhaust rearwardly in the channel 112 between tubes 90 and 94 as shown by arrow 13.

The T-joint 66 isolates the etch zone 117 from the reaction chamber 110. The joint 64 is designed so as not to cause a problem with the heating or passage of hot silicon wafers. Except for the cap 68 with the appropriate elastomer seals 70, the apparatus as shown in FIG. 2A is constructed of quartz.

The exhaust channel 112 is kept at a slightly negative pressure with respect to the other zones such as Heat-up zone 104 and the heat up zone 48a. Accordingly cross-leakage of compatible gases will be reduced and any that leak will be drawn along with the purging gas 88 into the exhaust channel 112.

In practice, the silicon wafers are heated in hydrogen gas only within the tube portion 96 while the reactive etch gas stream enters the etch zone 117 as by arrow 98. The HCl gas etches the wafers 32 inside tube 94 in the etch zone 117 and the reaction products exhaust along the channel 112. The respective tubes 90, 94 and 96 are suitably sealed from one another at their respective cold-end junctions in the entrance zone 54 as illustrated in FIG. 1.

Tube 180 similar in telescopic arrangement slides over member 83 in a crossfitting relationship that is sufficient to prevent any harmful cross-leakage of gases between tube 180 and portions external to tube 180 within heat-up zone 48a. A nominal amount of cross-leakage however can be tolerated in this vicinity because the wafers 32 are in the process of being allowed to cool from the higher temperature in etch zone 117 and, moreover, because there are no cold gases blowing on the wafers 32. In other words, the purging gases 88 can be allowed to be preheated at a high temperature because there are no low temperature limited seals in zone 111. Moreover, heating of the wafers in the heat-up zone 48a or the susceptors associated with the wafers may advantageous be heated from the bottom surface alone of the reactor.

After the wafers are passed through the heat up zone 48a the diffusion of the gases after passing through tube 72 and 80 cause the deposition in the deposition zone 50a of the epitaxial layers on the heated wafers in the manner described hereinabove for FIG. 1.

A suitable baffle 116 is provided to restrict the nominal diffusion of gases around entrance paths such as between the outside surface of tube 90, that is, the channel 115, and the inside surface of the main reactor tube 160.

FIG. 3A illustrates typical temperatures at respective portions of the reaction chamber 10 (shown in FIG. 1). The wafers 32 are passed through the input section 12 at an initial temperature of 200° C. and heated by the hydrogen gases to about 300° C. As the wafers are passed through heat up zone 48 they are heated to a temperature in the range of 940° to 1250° C. in order to prepare the wafers to receive the particular chemical source material selected for the process. In the preferred form of the invention using dichlorosilane the temperature range at the input to the deposition zone 50 should be about 1080° to 1150° C. Using silicon tetrachloride the temperature should be about 1160° to 1250° C., for trichlorosilane the temperature should be about 1100° to 1200° C. and for silane the temperature should be about 940° to 1050° C. As the wafers are passed through zone 50, the material from the reacting gases are deposited on the surface in a manner as described hereinabove. The wafers are then passed into the cool down zone 52 wherein the temperature of the wafer drops to about 300° C. as they exit the zone 52 into the exit zone 14. The schematic in FIG. 3A illustrates alternate ways of feeding the wafers into the reaction chamber 11 of FIG. 1. The arrows 82 illustrate a system similar to that shown in FIG. 1 by which the wafers are supplied longitudinally of the system and exit as shown by arrows 84 also longitudinally of the system.

In an alternative embodiment, the wafers 32 are carried vertically into the input section 12 as indicated by arrows 86 and then are moved longitudinally into the chamber 11, exiting vertically downwardly as indicated by arrow 88. A suitable wafer carrier 90 (illustrated in FIG. 3B) is formed of a series of horizontal plates 92 coupled to each other by a U-bracket 94 passing through apertures 96. A moving chain 98 of molybdenum is attached to the brackets 94 to effect the movement of the carriers 90 through the reactor.

Reference is now made to FIG. 4 which illustrates in partially exploded sections an epitaxial reactor test chamber 200 according to the invention. Reactor 200 provides an experimental test chamber for experimentally determining various parameters of the system that would be needed to design a full scale manufacturing reactor of continuous or fixed batch form. Reactor 200 comprises a conventional horizontal epitaxial reactor tube 202 formed of quartz. It may be 6 inches (15 cm) wide, 2 inches (5.1 cm) high and 82 inches (208 cm) long. A flange 204 is formed on or affixed to one end of the tube 202 and has an aperture 206 to receive a horizontal flat tube 208. A tube 210 serving to supply hydrogen into the reactor is passed through an closure end plate 212. In addition, a tube 214 for providing the chemical source gases is provided in another portion of the plate 212 in a position to be spacially separated from the tube 210 and thereby allow the respective gases to be passed into the chamber in spacially separated paths longitudinally of the reactor.

Exhaust pipe 216 is provided at the distal end of the tube 202 for exhausting the gases therefrom. A tube 218 is provided for passing hydrogen into the chamber for the purpose of purging the wafers after deposition. A horizontal flat tube 220 is positioned at the distal end of the tube serving as a separation means similar to tube 20 of FIG. 1. Tube 208 serves to separate the two gas streams in a manner similar to that of tube 18 of FIG. 1 to provide the growth profile shown in FIG. 6. The substrates, not shown, to be deposited for test purposes are suitably placed into the chamber on a susceptor to simulate reactor 10 (FIG. 1) in a stationary mode. The wafers are first heated by suitable means, not shown, while hydrogen is passed through tubes 210 and 214 to a temperature in each of the respective zones 222, 224 and 226 to simulate the temperature gradient as, indicated, for example, in FIG. 3A. After the wafers are heated to deposition temperature, in the deposition zone 224 source gas is added to hydrogen through tube 214. Deposition occurs as a result of the diffusion of the gases after passing through tubes 210 and 214 causing the material to be deposited on the heated substrates to the desired thickness. The flow of source gas is stopped, and hydrogen is used alone to purge the chemicals from the chamber 202 through tubes 210, 214 and 218 from the chamber 202 via tube 216. The wafers are then allowed to cool for measurements.

Measurements of deposition rates on the wafers responsive to predetermined gas flows using equations (1) and (2) described above, may be used to provide data to determine the design criteria needed for a large scale reactor.

The CVD reactor may be designed to deposit material on moving wafers as in FIG. 1 or on non-moving wafers in a fixed batch system. FIG. 4 illustrates the principle of this invention as it would be applied to a conventional CVD batch reactor. For such an application, the tube 220 will not be used since it serves only to determine experimentally the parameters needed for a continuous mode CVD reactor. In a batch process the wafers are placed in a predetermined location in zone 224. After heating the wafers to epitaxial deposition temperature chemical source gas is added to the hydrogen gas through tube 214 and the two streams through tubes 214 and 210 are passed into the chamber and kept separated in laminar flow by the upper wall of tube 208. At the end of the tube the two streams join with little turbulence and diffuse to deposit the material on the heated wafers. The separated streams thus develop a growth profile such as shown in FIG. 6.

The invention is particularly useful in CVD processes for making solar cells and integrated circuit (IC) wafers. Since solar cells typically need layers 20 $\mu$m thick, the deposition zone 50 should be 4-5 feet (1.22 to 1.52 meters) long. However, since IC's need thinner layers, in the range of 1-15 $\mu$m, the deposition zone 50 can be shorter. For a 3 $\mu$m layer, for example, zone 50 need be only two feet (0.6 meters) long.

While the invention has been described in terms of epitaxial silicon growth in a CVD reactor, it will be appreciated that any process for depositing one material on a substrate in a CVD reactor may be used in the practice of this invention. For example, silicon oxide deposited on a silicon substrate using silane gas plus an oxygen containing gas will serve as the source gas. Other examples will include depositing silicon nitride, polycrystalline or amorphous silicon on suitable substrates.

Moreover, while the chamber 10 is described as being rectangular, for low pressure or vacuum CVD system, chamber 10 is advantageously oval or cylindrical for structural strength.

What is claimed is:

1. A method for silicon epitaxial growth by continuous chemical vapor deposition of silicon material deposited continuously epitaxially on a flat substrate surface of crystalline material in a reactor tube defined by an elongated open chamber having a longitudinal axis and having respective ends connected to a gas input section and a gas output section, comprising the steps of:

providing at said input section a longitudinal substantially laminar flow of a first stream of a chemical source gas containing said material and a carrier gas through a first longitudinal passageway having a predetermined distance in a first zone of said chamber;

providing at said input section a longitudinal substantially laminar flow of a second gas stream through said chamber along a path in a second longitudinal passageway having the same said predetermined distance and isolated from but substantially parallel to said first passageway carrying said first gas stream through said first longitudinal zone of said chamber;

moving substrates at a rate of about 0.5 feet/minute serially and longitudinally through said chamber adjacent only to said second gas stream in said isolated passageway and in a path substantially parallel to said first and second passageways;

diffusing in a second longitudinal zone of said chamber said first gas stream into said second stream at the end of said first zone to effect epitaxial deposition of the silicon material from said first stream on the surface of said substrates such that the epitaxial deposition rate resulting from said diffusion at the entrance and exit portions of said second zone is less than the epitaxial deposition rate in the intermediate portion of the second zone;

heating to a predetermined temperature said substrates before passing into said second zone;

balancing the forward momentums of the first and second gas streams to be substantially equal and to thereby reduce turbulent flow of the gas streams towards a minimum as they diffuse together subsequent to passing through their said respective passageways for said predetermined distance; and passing said substrates through a third passageway in a third longitudinal zone while passing a stream of purging gas through said third passageway, said second gas stream and said purging gas stream serving to provide a viscous seal at the input section and output section of said chamber;

the first, second and third longitudinal zones extending along chamber axis whereby the substrates and gases are moved longitudinally substantially linearly along said longitudinal axis through said chamber;

whereby a significantly large throughput of substrates deposited with said material to a substantially uniform thickness can be achieved at a high rate as the turbulence of said respective gas streams is reduced to a minimum.

2. The method of claim 1 comprising the step of providing said first gas stream with a relatively low forward momentum compared to the momentum of said second gas stream.

3. The method of claim 1 for etching said substrates before said deposition step, further comprising the steps of:

heating to a second predetermined temperature said substrates while passing through a first longitudinal zone in said input section;

passing an etchant gas mixture over said substrates in a second longitudinal input section zone following said first input section zone;

exhausting said etchant gas mixture from said second input section zone at a slightly negative pressure relative to the ambient pressure of said other zones;

moving said etched substrates through a zone having a purging gas at a pressure slightly greater than said negative ambient pressure of said etchant gas; and passing said substrates into said first zone of said chamber for heating to said first-mentioned predetermined temperature.

4. The method according to claim 1 wherein said flat substrate is a wafer of silicon, said first gas stream is trichlorosilane mixed with hydrogen and said second gas stream is hydrogen further comprising the steps of:

providing said first gas stream at a temperature in the range of 1080° to 1150° C., heating said wafers in said first zone from an initial temperature of about 200°–300° C. to a temperature at the exit of said first zone of about 1080° to 1180° C.

5. The method according to claim 1 or 4 further comprising the steps of forming said chamber of quartz and said input and output sections of metal, and sealing the quartz chamber to the respective material sections with an elastomer seal under compression whereby the respective junctions of said chamber to said sections can be operated at temperatures relatively low as compared to the temperature in said chamber.

* * * * *